United States Patent
Chen

(10) Patent No.: US 10,076,066 B2
(45) Date of Patent: Sep. 11, 2018

(54) HEAT DISSIPATING CONTROL MODULE AND RELATED SERVER DEVICE AND HEAT DISSIPATING CONTROL METHOD

(71) Applicant: Wistron Corporation, New Taipei (TW)

(72) Inventor: Hua Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 45 days.

(21) Appl. No.: 14/816,051

(22) Filed: Aug. 2, 2015

(65) Prior Publication Data
US 2016/0278244 A1    Sep. 22, 2016

(30) Foreign Application Priority Data

Mar. 17, 2015   (TW) .............................. 104108498 A

(51) Int. Cl.
H05K 7/20   (2006.01)

(52) U.S. Cl.
CPC ................. *H05K 7/20836* (2013.01)

(58) Field of Classification Search
CPC ................. H05K 7/20836; H05K 7/20409
USPC ................. 361/679.54, 704, 695, 93.8
See application file for complete search history.

(56) References Cited

U.S. PATENT DOCUMENTS

| | | | |
|---|---|---|---|
| 9,746,224 B2 * | 8/2017 | Lu ............................ | F25B 49/02 |
| 2004/0070932 A1 * | 4/2004 | Dobbs ..................... | G06F 1/206 |
| | | | 361/679.48 |
| 2006/0121421 A1 * | 6/2006 | Spitaels .................. | G06F 1/206 |
| | | | 434/118 |
| 2007/0125107 A1 * | 6/2007 | Beam ..................... | F24F 11/0012 |
| | | | 62/186 |
| 2009/0100848 A1 * | 4/2009 | Kuriyama .......... | H05K 7/20745 |
| | | | 62/132 |
| 2010/0215510 A1 * | 8/2010 | Tsai ........................ | F04D 27/00 |
| | | | 417/32 |
| 2015/0003010 A1 * | 1/2015 | Kinstle, III ........ | H05K 7/20836 |
| | | | 361/679.49 |

FOREIGN PATENT DOCUMENTS

TW    I339314    3/2011

OTHER PUBLICATIONS

Office action dated Sep. 25, 2015 for the Taiwan application No. 104108498, filing date: Mar. 17, 2015, p. 1 line 13~14, p. 2~6 and p. 7 line 1~11.

\* cited by examiner

*Primary Examiner* — Mandeep S Buttar
(74) *Attorney, Agent, or Firm* — Winston Hsu

(57) ABSTRACT

A heat dissipating control module for a server device with a heat dissipating module includes a sensing unit, for detecting at least one environment parameter of an environment where the server device located at; and a control unit, coupled to the sensing unit for adjusting at least one heat dissipating parameter according to the at least one environment parameter and a plurality of heat dissipating parameter data, wherein the at least one heat dissipating parameter is utilized for controlling operations of the heat dissipating module.

3 Claims, 3 Drawing Sheets

HEAT DISSIPATING CONTROL MODULE AND RELATED SERVER DEVICE AND HEAT DISSIPATING CONTROL METHOD

BACKGROUND OF THE INVENTION

1. Field of the Invention

The present invention relates to a heat dissipating control module for a server and related server device and heat dissipating method, and more particularly, to a heat dissipating control module capable of adjusting operations of heat dissipating module in the server according to the environment where the server located at and related server device and heat dissipating control method.

2. Description of the Prior Art

With advances in the communication technology, users can rapidly read and store required information via a network with a low latency. Under such a condition, the information may be stored in remote servers and does not required to be stored in the personal computer. When needing to use (e.g. read or edit) the information, the user downloads the information via the network to the personal computer. The cost on the storage device therefore can be reduced. Furthermore, the information can be on-line edited by multiple users via storing the information on the remote server. Even if the multiple users locate at difference places, the multiple users can work together and the costs and time spend on the commute can be decreased. In addition, the user also can synchronize the information stored in difference places (e.g. in the office and home) via storing the information in the remote servers. The user can use the information of the latest version in different places.

The abovementioned service is also called cloud service. In order to provide the cloud service, numerous companies purchase and configure a significant number of servers (i.e. the remote servers) to store the significant amount of user information. During operations of the servers, the servers generate considerable heat resulting the temperature of the servers rises. If the servers cannot dissipate the heat generated during the operations, the server may be overheat and may works abnormally. Thus, how to ensure the servers equipping sufficient heat dissipating ability becomes a topic to be discussed.

SUMMARY OF THE INVENTION

In order to solve the above problem, the present invention provides a heat dissipating control module capable of adjusting operations of heat dissipating module in the server according to the environment where the server located at and related server device and heat dissipating control method.

The present invention discloses a heat dissipating control module for a server device with a heat dissipating module. The heat dissipating control module comprises a sensing unit, for detecting at least one environment parameter of an environment where the server device located at; and a control unit, coupled to the sensing unit for adjusting at least one heat dissipating parameter according to the at least one environment parameter and a plurality of heat dissipating parameter data, wherein the at least one heat dissipating parameter is utilized for controlling operations of the heat dissipating module.

The present invention further discloses a server device. The server device comprises a heat dissipating module, for dissipating heat according to at least one heat dissipating parameter; and a heat dissipating control module, comprising a sensing unit, for detecting at least one environment parameter of an environment where the server device located at; and a control unit, coupled to the sensing unit for adjusting the at least one heat dissipating parameter according to the at least one environment parameter and a plurality of heat dissipating parameter data.

The present invention further discloses a heat dissipating control method, for a server device with a heat dissipating module. The heat dissipating method comprises detecting at least one environment parameter of an environment where the server device located at; and adjusting at least one heat dissipating parameter according to the at least one environment parameter and a plurality of heat dissipating parameter data, wherein the at least one heat dissipating parameter is utilized for controlling operations of the heat dissipating module.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
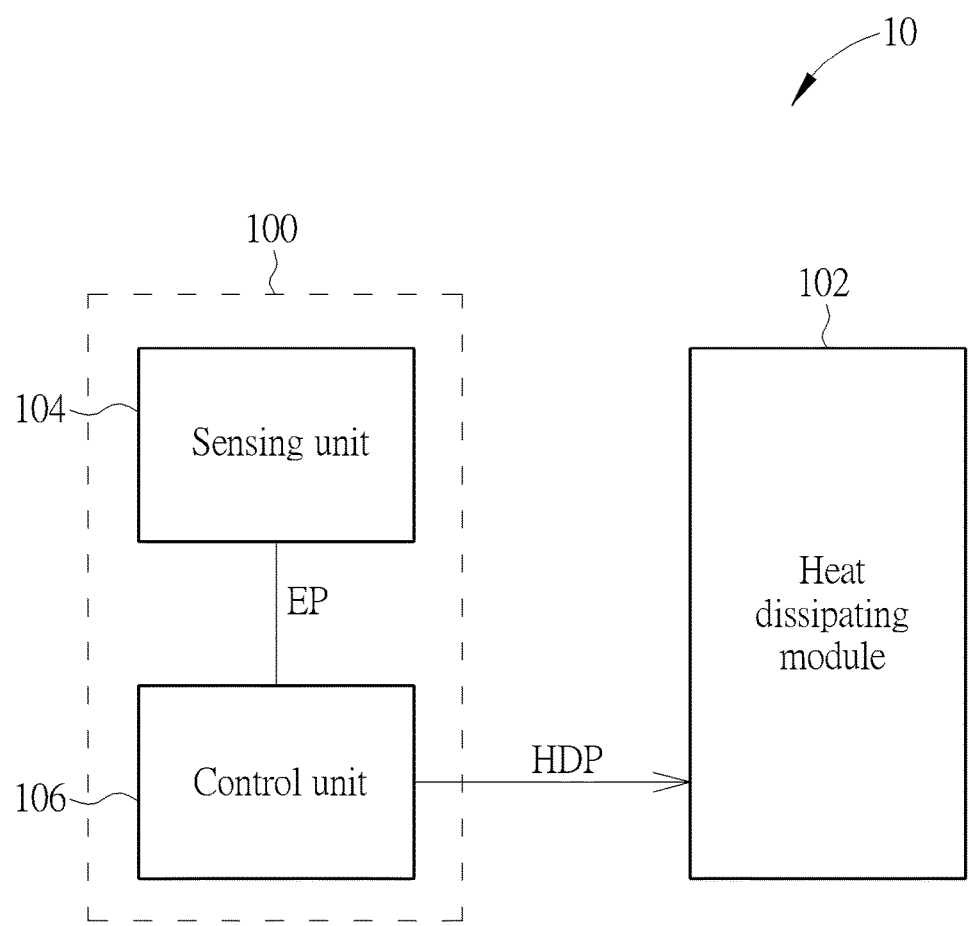
FIG. 1 is a schematic diagram of a server device according to an example of the present invention.

Please refer to FIG. 1, which is a schematic diagram of a server device 10 according to an example of the present invention. The server device 10 may be a sever product such as a blade server or a storage server, and is not limited herein. As shown in FIG. 1, the server device 10 comprises a heat dissipating control module 100 and a heat dissipating module 102. In order to simplify illustrations, the components that do not directly relate to the concept of the present invention are not shown in FIG. 1. The heat dissipating control module 100 comprises a sensing unit 104 and a control unit 106. The sensing unit 104 is utilized for sensing environment parameters EP of the environment where the server device 10 located at. The control unit 106 is utilized for generating heat dissipating parameters HDP according to the detected environment parameters EP. The heat dissipating module 102 may be a fan module and is utilized for dissipating heat generated during the operations of the server device 10 according to the heat dissipating parameters HDP. In other words, the server device 10 adjusts the heat dissipating parameters HDP according to the surrounding environment, to avoid that the heat dissipating module 102 provide insufficient heat dissipating ability or consumes additional power consumption because of the changes of the environment.

As to the detailed operations of the server device 10 please refer to the followings. Since the air density varies with the altitude, the heat dissipating ability of the heat dissipating module 102 may be insufficient for dissipating the heat generated during the operations of the server device 10 and the server device 10 may enter thermal shut down if the heat dissipating parameters HDP does not changes with the altitude of the environment. In an example, the sensing unit 104 comprises an atmosphere pressure sensor (e.g. an atmospheric pressure gauge) for sensing the atmosphere pressure AP and the control unit 106 pre-stores heat dissipating parameter data corresponding to different altitudes. When the server device 10 is turned on, the sensing unit 104 sense the atmosphere pressure AP (corresponding to the environment parameters EP) of the environment where the server device located at. According to the atmosphere pressure AP acquired by the sensing unit 104, the control unit 106 determines the altitude ALT of the environment where the server device 10 located at and interpolates the heat dissipating parameter data corresponding to different altitudes to acquire the optimized heat dissipating parameters HDP. That is, the control unit 106 adjusts the heat dissipating parameters HDP, utilized for controlling the heat dissipating module 102, according to the atmosphere pressure AP (corresponding to the altitude ALT) of the environment in this example. Even if the altitude of the server device 10 changes, the heat dissipating module 102 still can operates according to the optimized heat dissipating parameters HDP. The server device 10 therefore can avoid thermal shut down or consuming additional power consumption.

After acquiring the heat dissipating parameters HDP, the control unit 106 may store the heat dissipating parameters HDP and the current altitude ALT. When the server device 10 is reset or rebooted, the control unit 106 outputs the stored heat dissipating parameters HDP if determining the difference between the detected altitude ALT and the stored altitude ALT is small and negligible.

Note that, the control unit 106 is not limited to determine the altitude ALT of the environment where the server device 10 located at according to the atmosphere pressure AP. For example, the sensing unit 104 may further comprise a thermometer for detecting the environment temperature TEM. Under such a condition, the control unit 106 acquires the altitude ALT according to the atmosphere pressure AP and the temperature TEM.

Figure 2:
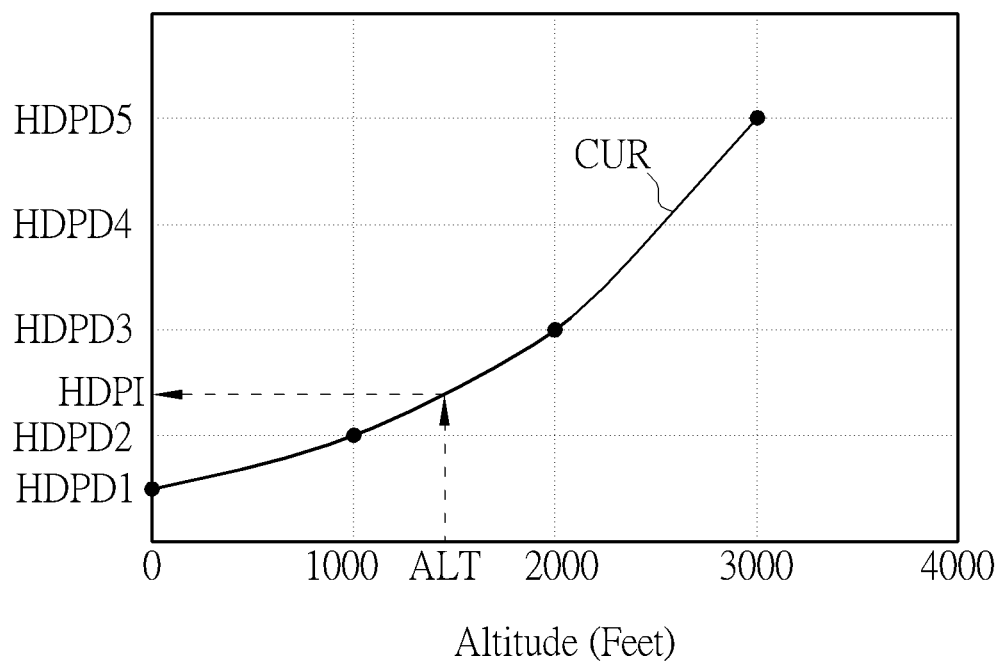
FIG. 2 is a schematic diagram of the control unit shown in FIG. 1 acquiring the heat dissipating parameters.

Please refer to FIG. 2, which is a schematic diagram of the control unit 106 acquires the heat dissipating parameters HDP. As shown in FIG. 2, the control unit 106 pre-stores the heat dissipating parameter data HDPD1-HDPD4, the optimized heat parameters HDP of the heat dissipating module 102 when the server device 10 operates under different atmosphere pressures. Since the variations of the air density changing with the altitude is small, the difference among the altitudes corresponding to the heat dissipating parameter data HDPD1-HDPD4 can be enlarged. In this example, the heat dissipating parameter data HDPD1-HDPD4 are corresponding to altitudes 0, 1000 feet, 2000 feet, 3000 feet and 4000 feet. According to the atmosphere pressure AP detected by the sensing unit 104, the control nit 106 may acquire the corresponded altitude ALT by looking up table or performing calculations. Next, the control unit 106 interpolates the heat dissipating parameter data HDPD1-HPDP4 according to the altitude ALT, to acquire the optimized heat dissipating parameters HDP. In this example, the control unit 106 interpolates the heat dissipating parameter data HDPD1-HPDP4 according to a curve build by the heat dissipating parameter data HDPD1-HPDP4, to acquire heat dissipating parameters HDPI as the heat dissipating parameter HDP. According to different applications and design concepts, the control unit 106 may utilize different methods to perform the interpolations. For example, the control unit 106 may perform linear interpolations according to the altitude ALT and the heat dissipating parameter data HDPD1-HDPD4, to acquire the heat dissipating parameters HDP, and is not limited herein.

Note that, the heat dissipating parameters HDP may change according to the control method of the heat dissipating module 102. For example, the heat dissipating parameters HDP may comprise a heat dissipating parameters HDP_P, HDP_I and HDP_D when the heat dissipating module 102 realized in Proportional Integral Derivative (PID) control method. The heat dissipating parameter HDP_P relates to the current heat dissipating ability (e.g. the current fan speed) of the heat dissipating module 102. The heat dissipating parameter HDP_I relates to a gain corresponding to the difference between the heat dissipating ability and target heat dissipating ability of the heat dissipating module 102 in a period. The heat dissipating parameter HDP_D relates to a gain corresponding to the difference between the future heat dissipating ability and target heat dissipating ability of the heat dissipating module 102. The heat dissipating control module 100 therefore can adjust the operations (e.g. the speed of changing the heat dissipating ability, the damping of the heat dissipating ability when approaching the target heat dissipating ability) of the heat dissipating module 102 via adjusting the heat parameters HDP_P, HDP_I and HDP_D.

The heat dissipating control module of the above example adjusts the heat dissipating parameters for controlling the heat dissipating module according to the environment of the server device. The heat dissipating module provides sufficient heat dissipating ability even if the environment of the server device changes. According to different applications and design concepts, those with ordinary skill in the art may observe appropriate alternations and modifications. For example, the sensing unit of the heat dissipating control module may further comprise a Hygrometer for detecting the environment humidity and the control unit pre-stores optimized heat dissipating parameters corresponding to different humidity values. Under such a condition, the control unit interpolates the optimized heat dissipating parameters corresponding to different humidity values according to the humidity of the current environment to generate the optimized heat dissipating parameters to the heat dissipating module.

Figure 3:
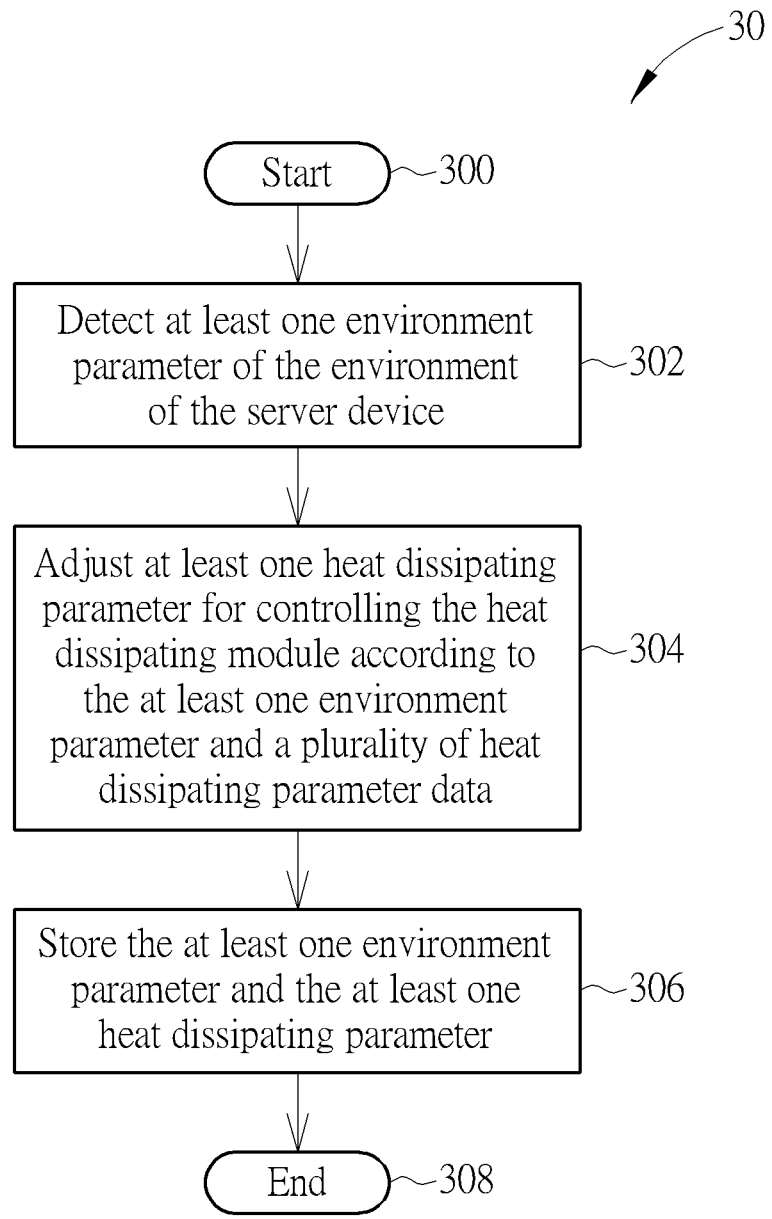
FIG. 3 is a heat dissipating control method according to an example of the present invention.

The process of the heat dissipating control module adjusting the heat dissipating parameters, for controlling the heat dissipating module, according to the environment of the server device in the above example can be summarized into a heat dissipating control method 30 shown in FIG. 3. The heat dissipating control method 30 may be utilized in a server device with a heat dissipating module and comprises the following steps:

Step 300: Start.

Step 302: Detect at least one environment parameter of the environment of the server device.

Step 304: Adjust at least one heat dissipating parameter for controlling the heat dissipating module according to the at least one environment parameter and a plurality of heat dissipating parameter data.

Step 306: Store the at least one environment parameter and the at least one heat dissipating parameter.

Step 308: End.

According to the heat dissipating control method 30, the server device first detects at least one environment parameter (e.g. the atmosphere pressure, the temperature or the humidity) of the environment where the server device located at. According to the at least one environment parameter, the server device interpolates heat dissipating parameter data pre-stored in the server device, to acquire at least one optimized heat dissipating parameter for controlling the heat dissipating module. In such a condition, the at least one heat dissipating parameter utilized for controlling the heat dissipating module changes with the environment of the server device. The heat dissipating module can avoid providing insufficient heat dissipating ability due to the environment of the server device changes. After acquiring the at least one heat dissipating parameter, the server device may store the at least one heat dissipating parameter and the current at least one environment parameter. When the server device is reset or rebooted, the server device may use the at least one stored heat dissipating parameter when determining the difference between the at least one detected environment parameter and the at least one stored environment parameter is small and negligible.

To sum up, the heat dissipating control module of the above example adjusts the heat dissipating parameters for controlling the heat dissipating module in the server device according to the environment where the server device located at. Under such a condition, even if the environment of the server device changes, the heat dissipating module still can utilize the optimized heat dissipating parameters to provide the sufficient heat dissipating ability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A heat dissipating control module for a server device with a heat dissipating module, the heat dissipating control module comprising:
   a sensing unit, for detecting an atmosphere pressure of an environment where the server device located at; and
   a control unit, coupled to the sensing unit for determining an altitude of the environment according to the atmosphere pressure, and using a proportional-integral-derivative unit to adjust a heat dissipating parameter according to the altitude and a plurality of heat dissipating parameter data, wherein the heat dissipating parameter is utilized for controlling operations of the heat dissipating module;
   wherein the control unit interpolates the plurality of heat dissipating parameter data according to the altitude, to adjust the heat dissipating parameter;
   wherein the plurality of heat dissipating parameter data is pre-stored in the control unit;
   wherein the heat dissipating parameter comprises a first heat dissipating sub-parameter, a second heat dissipating sub-parameter and a third heat dissipating sub-parameter, the first heat dissipating sub-parameter relates to a current heat dissipating ability of the heat dissipating module, the second heat dissipating sub-parameter relates to a gain corresponding to a difference between the current heat dissipating ability and a target heat dissipating ability of the heat dissipating module in a period, and the third heat dissipating sub-parameter relates to a gain corresponding to a difference between a future heat dissipating ability and the target heat dissipating ability of the heat dissipating module.

2. A server device, comprising:
   a heat dissipating module, for dissipating heat according to at least one heat dissipating parameter; and
   a heat dissipating control module, comprising:
      a sensing unit, for detecting an atmosphere pressure of an environment where the server device located at; and
      a control unit, coupled to the sensing unit for determining an altitude of the environment according to the atmosphere pressure, and using a proportional-integral-derivative unit to adjust a heat dissipating parameter according to the altitude and a plurality of heat dissipating parameter data;
   wherein the control unit interpolates the plurality of heat dissipating parameter data according to the at least one environment parameter, to adjust the at least one heat dissipating parameter;
   wherein the plurality of heat dissipating parameter data is pre-stored in the control unit;
   wherein the heat dissipating parameter comprises a first heat dissipating sub-parameter, a second heat dissipating sub-parameter and a third heat dissipating sub-parameter, the first heat dissipating sub-parameter relates to a current heat dissipating ability of the heat dissipating module, the second heat dissipating sub-parameter relates to a gain corresponding to a difference between the current heat dissipating ability and a target heat dissipating ability of the heat dissipating module in a period, and the third heat dissipating sub-parameter relates to a gain corresponding to a difference between a future heat dissipating ability and the target heat dissipating ability of the heat dissipating module.

3. A heat dissipating control method, for a server device with a heat dissipating module, the heat dissipating method comprising:
   detecting an atmosphere pressure of an environment where the server device located at; and
   determining an altitude of the environment according to the atmosphere pressure, and using a proportional-integral-derivative unit to adjust a heat dissipating parameter according to the altitude and a plurality of heat dissipating parameter data, wherein the heat dissipating parameter is utilized for controlling operations of the heat dissipating module;
   wherein the step of determining the altitude of the environment according to the atmosphere pressure, and using the proportional-integral-derivative unit to adjust the heat dissipating parameter according to the altitude and the plurality of heat dissipating parameter data comprises:
      interpolating the plurality of heat dissipating parameter data according to the altitude, to adjust the heat dissipating parameter;
   wherein the plurality of heat dissipating parameter data is pre-stored in the control unit;
   wherein the heat dissipating parameter comprises a first heat dissipating sub-parameter, a second heat dissipating sub-parameter and a third heat dissipating sub-parameter, the first heat dissipating sub-parameter relates to a current heat dissipating ability of the heat dissipating module, the second heat dissipating sub-parameter relates to a gain corresponding to a difference between the current heat dissipating ability and a target heat dissipating ability of the heat dissipating module in a period, and the third heat dissipating sub-parameter relates to a gain corresponding to a difference between a future heat dissipating ability and the target heat dissipating ability of the heat dissipating module.

* * * * *